(12) United States Patent
Kawamura

(10) Patent No.: US 8,044,575 B2
(45) Date of Patent: Oct. 25, 2011

(54) COLOR CONVERSION TYPE ORGANIC EL DISPLAY

(75) Inventor: Yukinori Kawamura, Yokohama (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 12/736,078

(22) PCT Filed: Jul. 23, 2009

(86) PCT No.: PCT/JP2009/063186
§ 371 (c)(1),
(2), (4) Date: Nov. 17, 2010

(87) PCT Pub. No.: WO2010/013637
PCT Pub. Date: Feb. 4, 2010

(65) Prior Publication Data
US 2011/0062859 A1    Mar. 17, 2011

(30) Foreign Application Priority Data
Jul. 29, 2008   (JP) .................................. 2008-195154

(51) Int. Cl.
*H01J 1/62*   (2006.01)
(52) U.S. Cl. ........................................ 313/504; 313/506
(58) Field of Classification Search .................. 313/498, 313/504, 506
See application file for complete search history.

(56) References Cited

U.S. PATENT DOCUMENTS

| | | | |
|---|---|---|---|
| 5,294,810 A | 3/1994 | Egusa et al. | |
| 5,683,823 A | 11/1997 | Shi et al. | |
| 5,949,188 A * | 9/1999 | Leising et al. | ................. 313/505 |
| 6,117,529 A * | 9/2000 | Leising et al. | ................. 428/209 |
| 6,670,772 B1 * | 12/2003 | Arnold et al. | ............. 315/169.3 |
| 6,696,177 B1 | 2/2004 | Hatwar | |
| 7,268,490 B2 * | 9/2007 | Oota | ............................ 313/506 |
| 2001/0043043 A1 | 11/2001 | Aoyama et al. | |
| 2003/0068524 A1 | 4/2003 | Hatwar | |
| 2003/0184216 A1 | 10/2003 | Yano et al. | |
| 2004/0051781 A1 | 3/2004 | Kawaguchi et al. | |
| 2004/0201048 A1 | 10/2004 | Seki et al. | |
| 2005/0062407 A1 | 3/2005 | Suh et al. | |
| 2006/0012288 A1 | 1/2006 | Terakado et al. | |

FOREIGN PATENT DOCUMENTS

| | | |
|---|---|---|
| CN | 1722925 A | 1/2006 |
| JP | 2991450 A | 10/1999 |
| JP | 2000-230172 A | 8/2000 |
| JP | 2000-243563 A | 9/2000 |
| JP | 2000-353594 A | 12/2000 |
| JP | 2002-075643 A | 3/2002 |

(Continued)

*Primary Examiner* — Vip Patel
(74) *Attorney, Agent, or Firm* — Rabin & Berdo, P.C.

(57) ABSTRACT

A color conversion type organic EL display can comprise an organic EL substrate that includes a substrate, a lower reflective electrode, a bank, and an organic EL layer sandwiched between the lower reflective electrode and an upper transparent electrode. The color conversion type organic EL display can further comprise a color filter substrate in which a black matrix and a color filter are formed in a pattern on a transparent substrate by a photo process, and which has a pixel region separated by the black matrix. The organic EL substrate and the color filter substrate can be bonded together and positioned such that the pixel region of the EL substrate and the pixel region of the color filter substrate are opposed.

8 Claims, 1 Drawing Sheet

FOREIGN PATENT DOCUMENTS

| | | |
|---|---|---|
| JP | 2002-093583 A | 3/2002 |
| JP | 2003-086380 A | 3/2003 |
| JP | 2003-217859 A | 7/2003 |
| JP | 2005-100939 A | 4/2005 |
| JP | 2006-032010 A | 2/2006 |
| JP | 2006-032021 A | 2/2006 |
| JP | 2007-157550 A | 6/2007 |
| JP | 2008-077860 A | 4/2008 |

* cited by examiner

COLOR CONVERSION TYPE ORGANIC EL DISPLAY

CROSS-REFERENCE TO RELATED APPLICATIONS

This application is a national stage application under 35 U.S.C. §371 of International Application No. PCT/JP2009/063186, filed Jul. 23, 2009, and claims the benefit under 35 U.S.C. §119 of the earlier filing date of Japanese Patent Application 2008-195154, filed Jul. 29, 2008. International Application No. PCT/JP2009/063186 and Japanese Patent Application 2008-195154 are hereby incorporated herein in their entirety by reference.

TECHNICAL FIELD

This invention relates to a device structure of an organic display, in which full-color display is achieved by forming a color conversion film directly on a top-emission type organic EL device.

BACKGROUND ART

In recent years, active research aimed at commercialization of organic EL devices has been conducted. Organic EL devices can achieve high current densities at low voltages, and so are expected to make possible high emission brightnesses and high emission efficiencies, and in particular, the commercialization of organic multicolor EL displays capable of high-definition multicolor or full-color display is expected. One example of methods to achieve multicolor or full-color display of organic EL displays is a method in which a plurality of types of color filters which transmit light in specific wavelength regions (color filter method) are used. When applying the color filter method, the organic EL device used is required to emit, as multicolored light, so-called "white light", which contains light in three primary colors (red (R), green (G), and blue (B)) in a good balance.

In order to obtain a multicolor-emission organic EL device, the following, and similar, are being studied:

(a) methods of using an emission layer containing a plurality of light-emitting dyes, and simultaneously exciting the plurality of emitting dyes (see Japanese Patent Publication No. 2991450 and Japanese Patent Application Laid-open No. 2000-243563);

(b) methods of using an emission layer containing a host emission material and a guest emission material, exciting the host emission material and causing emission, and simultaneously moving energy to the guest material, causing the guest material to emit light (see U.S. Pat. No. 5,683,823, Specification);

(c) methods of using a plurality of emission layers containing different emitting dyes, and exciting the emitting dyes in the respective layers; and (d) methods of using an emission layer containing an emitting dye and a carrier transport layer adjacent to the emission layer and containing an emissive dopant, and from the excitons generated by carrier recombination in the emission layer, a portion of the excitation energy is moved to the emissive dopant, and the emissive dopant is caused to emit light (see Japanese Patent Application Laid-open No. 2002-93583 and Japanese Patent Application Laid-open No. 2003-86380).

However, the above-described multicolor-emission organic EL devices rely on either simultaneous excitation of a plurality of types of emissive materials, or on movement of energy between a plurality of types of emissive materials. It has been reported that in such devices, the balance of emission intensities among emissive materials changes with the passage of time during driving or with the current passed, and that there are concerns that the hues obtained may change.

As other methods of obtaining a multicolor-emission organic EL device, Japanese Patent Application Laid-open No. 2002-75643, Japanese Patent Application Laid-open No. 2003-217859 and Japanese Patent Application Laid-open No. 2000-230172 propose color conversion methods in which a monochromatic-emission organic EL device and a color conversion film are used. The color conversion film used is a layer containing one, or a plurality of color conversion materials which absorb short-wavelength light and convert the light to longer wavelengths. As methods of formation of color conversion films, application of an application liquid in which color conversion material is dispersed in a resin, and use of dry processes such as evaporation deposition or sputtering to deposit color conversion materials, are being studied.

However, as the concentration of the color conversion material in a color conversion film rises, a phenomenon called concentration quenching occurs, in which the absorbed energy repeatedly moves between the same molecules without resulting in emission, and deactivation occurs. In order to suppress this phenomenon, the color conversion material is dissolved or dispersed in some medium to lower the concentration, as described in Japanese Patent Application Laid-open No. 2000-230172 and elsewhere.

Here, if the concentration of the color conversion material is lowered, the absorbance of the light to be absorbed is reduced, and adequate converted light intensity cannot be obtained. To address this problem, the color conversion film is made thick, the absorbance is increased, and color conversion efficiency is maintained. When using such a thick color conversion film (film thickness approximately 10 µm), such problems as disconnection of electrode patterns at step portions, difficulty in increasing definition, and residual water or solvent in the film (when combined with an organic EL device, residual water or solvent causes alteration of the organic EL layer, resulting in display faults) exist. On the other hand, from the standpoint of reducing viewing angle dependence, there is also a conflicting demand for a thinner color conversion film.

In order to provide a color conversion film which can maintain adequate converted light intensity, use of a method of evaporation deposition of a host-guest system color conversion film having a film thickness of 2 µm or less is being studied in Japanese Patent Application Laid-open No. 2007-157550. However, when forming a color conversion film using an evaporation deposition method, if the film is formed over the entirety of the display face, division into three primary colors to cause emission is not possible, and so some means for forming a fine pattern corresponding to specific pixels becomes necessary.

At present, as a method of forming a pattern in a thin film of evaporation-deposited material, methods of selective application using a metal mask have long been used. However, due to limits on the mask material and thickness, the fineness of the pattern of the metal mask used has a limit of a definition level of 150 ppi. Application of selective application methods using metal masks to patterns with definitions higher than this entail such problems as increased difficulty, extreme difficulty when increasing the area, and reduced yields.

As a method of patterning a thick-film color conversion layer, Japanese Patent Application Laid-open No. 2006-32021 studies a method in which a relief pattern is formed on a supporting substrate, color conversion material is applied to the relief pattern portion, causing the depressed portions to be buried by the color conversion material, and then the color conversion layer is polished to planarize the surface and perform patterning. However, in the above method, there are the problems that the efficiency of material utilization of expensive color conversion material is poor, and moreover that the color conversion performance is degraded by direct polishing of the color conversion layer.

Further, Japanese Patent Application Laid-open No. 2000-353594 proposes a method in which barrier walls are formed in the vicinity of pixels on a substrate, and an inkjet method is used to selectively apply phosphor material between barrier walls to perform patterning. When performing patterning of a color conversion film using this method, because a dilute solution of color conversion material is used in the inkjet method, the need arises to make the height of the barrier walls approximately 10 times higher than the film thickness required for the color conversion material, in order to prevent flowing into adjacent pixels during dispensing. As a consequence, even in cases when (a) bonding with a separately manufactured organic EL device substrate, or (b) a planarization layer is provided on the color conversion layer, and an organic EL device is formed thereupon, a gap occurs between the color conversion layer and the organic EL device equal to the height of the barrier walls and the film thickness of the planarization layer. This gap causes the problems of crosstalk phenomena in which light from the EL device leaks into adjacent pixels, and of the phenomenon of losses due to inadequate incidence of light from the EL device onto the color conversion layer.

Recently, as means for resolving these problems, Japanese Patent Application Laid-open No. 2006-32010 has proposed an organic EL display structure in which a color filter and color conversion layer are formed, directly on the upper transparent electrode of a top-emission structure organic EL device in which an organic emission layer is sandwiched between a cathode and an anode on a substrate, and light with three primary colors is emitted. This method has advantages for increasing definition, but because low-molecular-weight organic EL material is presented as an example of the emission layer, the annealing temperature during formation of the color filter and color conversion layer is limited to 100° C. or lower. Consequently it is difficult to adequately remove from the color filter and color conversion layer the moisture and solvents which exert the most adverse effects on the organic EL material, and these can easily be imagined to critically degrade the device lifetime.

SUMMARY OF THE INVENTION

An object of this invention is to provide a color conversion type organic EL display, which performs multicolor emission with high efficiency and a long lifetime through the selective fine formation of a color conversion layer above an emission layer, without using metal masks which pose problems for resolution or expensive laser scanning devices.

In order to attain the above object, a color conversion type organic EL display of this invention is formed by bonding together: (1) an organic EL substrate that includes a substrate, a lower reflective electrode, a bank, an organic EL layer comprising a plurality of portions separated by the bank, an upper transparent electrode, and a color conversion layer separated by the bank, and that also has a pixel region separated by the bank; and (2) a color filter substrate in which a black matrix and a color filter are formed in a pattern on a transparent substrate by a photo process, and which has a pixel region separated by the black matrix, the bonding being carried out after performing positioning such that the pixel region of the EL substrate and the pixel region of the color filter substrate are opposed; and the color conversion type organic EL display is characterized in that the organic EL layer is sandwiched between the lower reflective electrode and the upper transparent electrode and has at least an emission layer made of a polymer material, and that the color conversion layer is formed on the upper transparent electrode, absorbs EL light emitted by the emission layer and emits light with a wavelength different from that of the EL light. Here, the color conversion layer may be formed directly on the upper transparent electrode. Alternatively, a transparent protective layer may be provided between the upper transparent electrode and the color conversion layer.

By means of the this invention adopting the configuration described above, a structure is employed in which an organic polymer EL material is used to form an emission layer divided by a bank held between a lower reflective electrode and an upper transparent electrode, a color conversion layer is formed directly on the upper transparent electrode, and moreover bonding is performed with a separate substrate on which a color filter and black matrix are formed, so that the following advantageous results are obtained.

(1) Normal photo processes can be used to accurately control film thickness, to form a color filter on a transparent substrate, so that variation in chromaticity can be held to a minimum.

(2) A color conversion layer is formed directly on an organic EL device, so that EL light is incident on the color conversion layer without loss, and a highly efficient organic EL display can be realized.

(3) By performing high-temperature annealing at 200° C. or higher after forming the color conversion layer, no water or organic solvent remains after bonding of the color filter substrate and the EL substrate, and an organic EL display with a long lifetime can be realized.

DETAILED DESCRIPTION OF THE INVENTION

Figure 1:
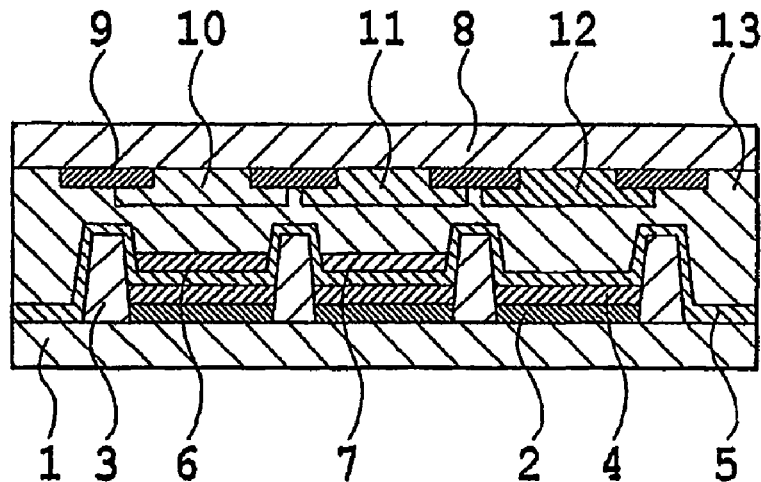
FIG. 1 is a summary cross-sectional view of the color conversion type organic EL display of a first embodiment of the invention.

Below, embodiments of the invention are explained in detail, referring to the drawings.

First Embodiment

FIG. 1 is a summary cross-sectional view of the color conversion type organic EL display of a first embodiment of the invention.

(TFT Substrate 1)

The TFT substrate 1 is a substrate on which is formed a TFT circuit comprising the organic EL display. The uppermost surface of the TFT substrate 1 is covered with an insulating planarization layer, and contact electrodes connected with the TFT circuit, divided into pixel units, are formed. Thereupon is formed a lower reflective electrode, joined with TFTs by contact electrodes, serving as cathodes or as anodes, and separated into pixel units.

The substrate material may be any insulating material; glass is primarily used, but a polymer material, ceramic, or Si single crystal may also be used without problem.

(Lower Reflective Electrode 2)

In order to form a top-emission structure organic EL device, a light-reflecting material must be used in the lower reflective electrode 2. Light-reflecting metals which can be used include Al, Ag, Mg/Al, Mg/Ag, Mg/In, and similar. It is preferable that the lower reflective electrode 2 be formed by an evaporation deposition method. When using the lower reflective electrode 2 as a cathode, an LiF thin layer can be inserted between [the lower reflective electrode 2] and the organic EL layer 4 as an electron-injecting material.

The lower reflective electrode 2 comprises a plurality of partial electrodes, separated and mutually independent, formed by using a normal photolithography process to perform patterning. Each of the plurality of partial electrodes is connected 1-to-1 with a contact electrode of the TFT substrate 1, forming a pixel region.

The lower reflective electrode 2 has a film thickness of 20 nm or greater and 200 nm or less. If the lower reflective electrode 2 is too thin, light is transmitted, and if too thick, surface roughness increases; a thickness of approximately 100 nm is preferable.

(Bank 3)

The bank 3 is a layer to separate the organic EL layer 4 and color conversion layer (6, 7), explained below. The bank 3 is formed having opening portions over each of the partial electrodes forming the lower reflective electrode 2. In this embodiment, the positions of the opening portions in the bank 3 are pixel regions, and the pixel regions are separated by the bank 3. As the material of the bank 3, generally a photosetting or photo/thermosetting resin is subjected to light and/or heat treatment, generating radicals and ions and causing polymerization or bridging, rendering the material insoluble and infusible. Further, in order to perform patterning, it is preferable that the photosetting or photo/thermosetting resin be soluble in an organic solvent or an alkaline solution prior to hardening.

Specifically, as the photosetting or photo/thermosetting resin, (1) a composition comprising an acrylic system polyfunctional monomer or oligomer having a plurality of acryloyl groups and/or methacryloyl groups, and a photo- or thermopolymerization initiator;

(2) a composition comprising a polyvinyl cinnamate ester and a sensitizer;

(3) a composition comprising a chain or ring olefin and a bis azide; and (4) a composition comprising a monomer having an epoxy group and a photoacid generator can be used.

In particular, when using the photosetting or photo/thermosetting resin (1) above, patterning using photo processes is possible, and is also preferable with respect to resistance to solvents, resistance to heat, and other aspects of reliability.

Other materials which can be used to form the bank 3 include polycarbonate (PC), polyethylene terephthalate (PET), polyethersulfone, polyvinyl butyral, polyphenylene ether, polyamide, polyether imide, norbornene system resin, methacrylic resin, isobutylene maleic anhydride copolymer resin, ring-shape polyolefin system and other thermoplastic resins, epoxy resin, phenol resin, urethane resin, acrylic resin, vinyl ester resin, imide system resin, urethane system resin, urea resin, melamine resin and other thermosetting resins, or polymer hybrids containing polystyrene, polyacrylonitrile, polycarbonate, or similar and trifunctional or tetrafunctional alkoxysilane, and similar.

As a method of forming the bank 3 using the above-described resin materials, an application method can be used, and in particular, it is preferable that a photo process be used. The bank 3 preferably has a film thickness of 3 to 5 μm. This is because, when using an inkjet application method to deposit the color conversion material described below, if the film thickness is small, liquid drops overflow to outside the pixels. Further, the side wall shape of the barrier walls may be forward-tapered, reverse-tapered, or vertical, and no limitations in particular are imposed.

Further, the bank 3 may be formed using an inorganic material. For example, inorganic oxides and inorganic nitrides such as $SiO_x$, $SiN_x$, $SiN_xO_y$, $AlO_x$, $TiO_x$, $TaO_x$, and $ZnO_x$, and similar can be used. No limitations in particular are imposed on the method of formation of the bank layer using an inorganic material, and a sputtering method, CVD method, vacuum evaporation deposition method, or similar can be used. Further, when using an inorganic material, patterning of the bank 3 is performed using dry etching. It is preferable that plasma etching be used for patterning a bank 3 using an inorganic material. A pattern is formed on the bank layer using a photoresist with satisfactory selectivity with respect to the inorganic material of the bank layer, dry etching is performed using a gas such as $CF_4$, $SF_6$, $CHF_3$, or Ar, and the bank 3 is patterned. Further, by changing the gas to $O_2$ and performing $O_2$ plasma etching, the resist used in patterning is etched. At this time, in order to enhance reactivity, a small amount of $CF_4$ or another fluoride gas may be added to the $O_2$.

Further, as necessary, hydrophilic or hydrophobic treatment may be performed, to change the wettability of the underlayer (lower reflective electrode 2 or upper transparent electrode 5) and/or the bank 3 with respect to the ink, described below (ink for formation of the organic EL layer 4 made of a polymer material, and/or ink for formation of the color conversion layers (6, 7)).

(Organic EL Layer 4)

An organic EL layer 4 of this invention is formed from a plurality of portions, separated by the bank 3. The organic EL layer 4 is formed in direct contact with the lower reflective electrode 2 and the upper transparent electrode 5. The organic EL layer 4 includes at least an emission layer. The emission layer is formed using a polymer material. polyphenylenevinylene and polyalkylphenylene can be applied in a pattern using an inkjet method as polymer materials which emit blue light, to form an emission layer. The emission layer has a film thickness of 30 to 100 nm, and preferably 50 nm.

On the emission layer, a casting method can be used to apply polytetrahydro-thiophenylene, which is a polymer precursor, and heating performed to convert the precursor into polyphenylenevinylene, so that a hole transport layer can be formed. The hole transport layer has a film thickness of 30 to 100 nm, and preferably 50 nm.

No limitations in particular are placed on the material used to form the emission layer and hole transport layer, so long as a polymer material with high heat resistance is used.

(Upper Transparent Electrode 5)

The upper transparent electrode 5 is either a cathode or an anode, used as an integrated common electrode. In FIG. 1, an example is shown of continuous formation so that the upper transparent electrode 5 covers the bank 3 and organic EL layer 4. As the upper transparent electrode 5, an oxide transparent electrode, or a half-mirror electrode comprising a thin metal layer, can be used. As the material used to form an oxide transparent electrode, ITO, IZO, or similar can be used. It is preferable that an oxide transparent electrode have a film thickness of 100 to 200 nm. As the material to form a half-mirror electrode, Al, Ag, or similar can be used. It is preferable that a half-mirror electrode have a film thickness of 5 to 20 nm.

(Color Conversion Layers 6, 7)

The color conversion layers comprise a plurality of portions separated by the bank 3. In this invention, one type, or a plurality of types of color conversion layers may be provided. In this embodiment, a red conversion layer 6 and a green conversion layer 7 are formed. The red conversion layer 6 and the green conversion layer 7 are formed from materials which absorb blue light emitted from the organic EL layer 4, and fluoresce to emit red light and green light respectively. No limitations in particular are imposed on these materials so long as dissolution in a solvent with a high boiling point (150° C. or higher) is possible. It is desirable that polymer materials rather than low-molecular-weight materials be used to form the color conversion layers (6, 7). This is because polymer materials can be annealed at high temperatures (150° C. or higher) after application.

In order to form color conversion layers between the bank 3 using an inkjet method, it is necessary that the viscosity of the polymer phosphor material solution, dissolved in a solvent, be in the range 10 to 20 mPa·S (cP). Concentrations to achieve such viscosities are approximately in the range 0.5 to 2 weight percent, and adjustment is possible within this range.

By keeping the thickness of the phosphor material after solvent drying within the range 100 to 600 nm, it is possible to maintain a satisfactory balance between adequate light absorption and transmittance. An effective thickness is between 100 and 200 nm.

In this embodiment, an inkjet method is used as the method of film formation, but the method is not limited to this method, and for example a method of selectively dispensing a solution continuously using a nozzle coater, or other methods can also be applied.

(Transparent Substrate 8)

A transparent substrate 8, with color filters (10 to 12) and black matrix 9 formed thereupon, is bonded with the EL substrate including a TFT circuit. The transparent substrate 8 must be transparent with respect to visible light, in order to extract light emitted from the organic EL layer 4 and the color conversion layers (6, 7). A glass substrate, plastic substrate, or similar can be used as the transparent substrate 8.

(Black Matrix 9 and Color Filters 10 to 12)

The color filters 10 to 12 used in a device of this invention are fabricated on the transparent substrate 8. As the materials of the color filters, color filter materials used in liquid crystal displays and other flat panel displays can be used. In recent years, pigment-disperse type color filters, with pigments dispersed in a photoresist, have frequently been used.

In a color filter for a flat panel display, generally a blue color filter 12 which transmits wavelengths of 400 nm to 550 nm, a green color filter 11 which transmits wavelengths of 500 nm to 600 nm, and a red color filter 10 which transmits wavelengths of 600 nm and greater, are each arranged; further, generally a black matrix 9 which does not transmit light in the visible range is arranged between each of the color filter pixels, primarily with the object of improving contrast. When forming a black matrix 9, each of the subpixels (that is, pixel regions) of each of the color filters is separated by the black matrix 9. As the material of the black matrix 9, any arbitrary material marketed for the black matrix of a flat panel display can be used.

(Adhesive Layer 13)

An adhesive layer 13 is a layer used for adhesion of an EL substrate and a color filter substrate. In adhesion of an EL substrate and a color filter substrate, no limitations in particular are imposed on the material used, so long as a transparent, liquid-state thermosetting type adhesive is used.

Second Embodiment

Figure 2:
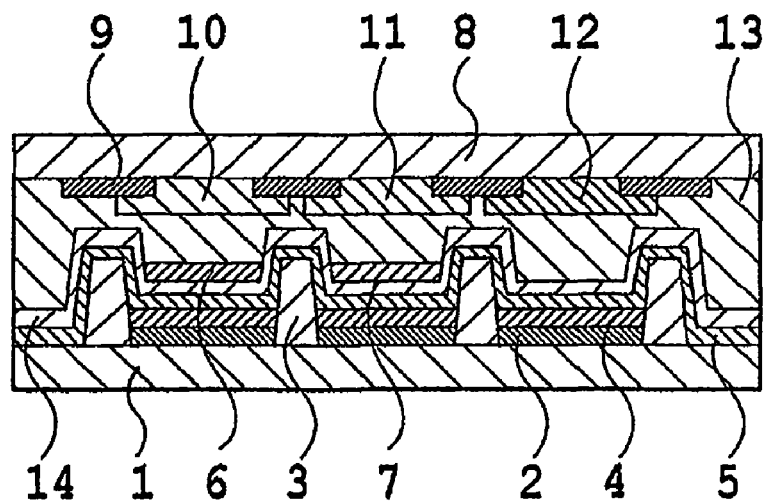
FIG. 2 is a summary cross-sectional view of the color conversion type organic EL display of a second embodiment of the invention.

FIG. 2 is a summary cross-sectional view of the color conversion type organic EL display of a second embodiment of the invention. The color conversion type organic EL display of the second embodiment of the invention has a configuration similar to that of the first embodiment, except for the existence of a transparent protective layer 14 on the upper transparent electrode 5, and the fact that the color conversion layers (6, 7) are formed on the transparent protective layer 14.

(Transparent Protective Layer 14)

The color conversion layers (6, 7) may be formed directly on the upper transparent electrode 5, but when the method of formation of the color conversion layers (6, 7) is a wet method, if there are pinholes in the upper transparent electrode 5, then intrusion of solvent into the organic EL layer 4 (and in particular the emission layer) is conceivable, and so a transparent protective layer 14 can be inserted on the upper transparent electrode 5.

As the material of the transparent protective layer 14, no limitations in particular are imposed, so long as the material is transparent, and does not dissolve in the solvent of the inkjet solution used to form the color conversion layers (6, 7). However, the transparent protective layer 14 must be formed using a method that does not cause pinholes. From this standpoint, it is preferable that a stamper or a CVD process be used to deposit an inorganic material to form the transparent protective layer 14. Materials which can be used to form the transparent protective layer 14 include $SiO_x$, $SiN_x$, SiON, and multilayer films of these, and similar. The transparent protective layer 14 can have a film thickness of 0.5 μm to 5 μm. It is preferable that the film thickness of the transparent protective layer 14 be approximately 1 μm. If the transparent protective layer 14 is thin, adequate protection functions are not exhibited, and if thick, optical absorption increases. Hence it is desirable that the material properties be considered in the optical design.

EXAMPLES

Example 1

This example is an example of the first embodiment of the invention. In this example, a substrate which was an alkali-free glass sheet of thickness 0.7 mm, on which was formed a circuit using amorphous Si-TFTs, was used as the TFT substrate 1.

On the TFT substrate 1, an evaporation deposition method was used to form an Al film of film thickness 100 nm, and a photolithography process was used to perform patterning into pixel region shapes. Specifically, a plurality of partial electrodes, having dimensions 300 μm×100 μm, were formed from the Al film. The gaps between the partial electrodes were 30 μm in the vertical direction and 10 μm in the horizontal direction. Partial electrodes were arranged with 50 in the vertical direction and 150 in the horizontal direction.

Next, after applying VPA100P5.0, manufactured by Nippon Steel Chemical Co., Ltd., a photolithography method was used to perform patterning, and a bank was formed in the gaps (in the vertical direction and horizontal direction) of the plurality of partial electrodes forming the lower reflective electrode 2. The bank film thickness was 5 μm. After bank formation, a LiF film of film thickness 1 nm was evaporation deposited, and a lower reflective electrode 2, comprising a layered member of Al and LiF, was obtained. The lower reflective electrode 2 of this example was a cathode.

Next, an inkjet method was used in pattern application of polyphenylenevinylene and polyalkylphenylene, to form an emission layer of film thickness 50 nm. Then, on the emission layer, a hole transport layer of film thickness 50 nm comprising polyphenylenevinylene was formed, and an organic EL layer 4 comprising a layered member of an emission layer and a hole transport layer was obtained.

Next, an evaporation deposition method was used to form an ITO film of film thickness 200 nm, and an upper transparent electrode 5 covering the bank 3 and organic EL layer 4 was obtained. The upper transparent electrode 5 of this example was an anode.

Next, the red conversion layer 6 and green conversion layer 7 were formed to obtain the EL substrate. Specifically, in every three pixel regions separated by the bank 3, an inkjet method was used to deposit a solution including PAT (poly [3-alkylthiophene]), and a red conversion layer 6 was formed. Further, in every three pixel regions, an inkjet method was used to deposit a solution including PDPA (poly[1-(p-n-butylphenyl)-2-phenylacetylene]), an acetylene derivative, and a green conversion layer 7 was formed. The concentrations of the inkjet solutions were 1 weight percent for both, and tetralin (boiling point 207° C.) was used as the solvent. The drying conditions were 200° C./30 minutes, and after drying the film thicknesses of the red conversion layer 6 and the green conversion layer 7 were both 200 nm.

Separately, 1737 glass (manufactured by Corning Inc.), which is an alkali-free glass substrate of thickness 0.7 mm, was prepared as the transparent substrate 8.

Next, on the transparent substrate 8, Color Mosaic CK-7001, CR-7001, CG-7001, and CB-7001 (all manufactured by Fujifilm Electronic Materials Co., Ltd.) were each applied, and a photolithography method was used to perform patterning, to form a black matrix 9, red color filter 10, green color filter 11, and blue color filter 12, and obtain a color filter substrate. The film thicknesses of each of the layers was 1 μm.

In the color filter substrate, pixel regions (subpixels) are delimited by the black matrix 9, comprising stripe-shape portions extending in the vertical direction and horizontal direction. The subpixel dimensions (that is, the dimensions of the opening portions of the black matrix 9) of the manufactured color filters (10 to 12) were 300 μm×100 μm, and the gaps between subpixels (that is, the width of the stripe-shape portions of the black matrix 9) were 30 μm in the vertical direction and 10 μm in the horizontal direction. Three of the subpixels (red, blue, green) formed one pixel, with 50 pixels arranged in the vertical direction and 50 pixels arranged in the horizontal direction.

The EL substrate and color filter substrate obtained were annealed at 100° C. or at 200° C. over 1 hour. After annealing, the T832 series (Nagase & Co., Ltd.), which is a low-viscosity liquid epoxy resin, was used to bond the EL substrate and the color filter substrate with the respective pixel regions opposed, to obtain a color conversion type organic EL display. The film thickness of the adhesive layer 13 was from 1 to 2 μm at the apex of the bank 3.

Example 2

This example is an example of the second embodiment of the invention. A procedure similar to that of Example 1 was repeated to form the structure of upper transparent electrode 5 and below. Next, on the upper transparent electrode 5, a layered film of an SiON film of film thickness 0.5 μm and an $SiN_x$ film of film thickness 0.5 μm was deposited using a sputtering method, to form a transparent protective layer 14. Next, a procedure similar to that of Example 1 was repeated to form a red conversion layer 6 and a green conversion layer 7, to obtain an EL substrate.

Next, a procedure similar to that of Example 1 was used to manufacture a color filter substrate and to perform bonding of the EL substrate and the color filter substrate, to obtain a color conversion type organic EL display.

Evaluations

When a low-molecular-weight material is used to form the organic EL layer 4 (particularly the emission layer), annealing temperatures which can be employed are approximately 100° C. and below. In order to confirm the advantageous results of the embodiments of this invention, the EL substrates and color filter substrates manufactured in Examples 1 and 2 were annealed over 1 hour at temperatures of 100° C. and 200° C. respectively, after which bonding was performed to manufacture organic EL displays. The emission states of the organic EL displays thus obtained were observed. The results are as shown in Table 1, and the advantageous results of embodiments of the invention were confirmed.

TABLE 1

Effects of annealing temperature

| | Annealing temperature | |
|---|---|---|
| | 100° C. | 200° C. |
| Example 1 | Non-emissive portions observed | No non-emissive portions |
| Example 2 | No non-emissive portions | No non-emissive portions |

The invention claimed is:

1. A color conversion type organic electro-luminescent (EL) display, comprising:
    an organic EL substrate that includes a substrate, a lower reflective electrode, a bank, an organic EL layer comprising a plurality of portions separated by the bank, an upper transparent electrode, a color conversion layer separated by the bank, and a pixel region separated by the bank, and
    a color filter substrate in which a black matrix and a color filter are formed in a pattern on a transparent substrate, and which has a pixel region separated by the black matrix,
    the organic EL substrate and the color filter substrate being bonded and positioned such that the pixel region of the organic EL substrate and the pixel region of the color filter substrate are opposed,
    wherein
    the organic EL layer is sandwiched between the lower reflective electrode and the upper transparent electrode and has at least an emission layer made of a polymer material, and
    the color conversion layer is formed on the upper transparent electrode, absorbs EL light emitted by the emission layer and emits light with a wavelength different from that of the EL light.

2. The color conversion type organic EL display according to claim 1, wherein the color conversion layer is formed directly on the upper transparent electrode.

3. The color conversion type organic EL display according to claim 1, further comprising a transparent protective layer provided between the upper transparent electrode and the color conversion layer.

4. A color conversion type organic electro-luminescent (EL) display, comprising:
- an organic EL substrate including an organic EL layer and at least one pixel region;
- a color filter substrate including at least one pixel region;
- a lower reflective electrode;
- an upper transparent electrode; and
- a color conversion layer;
wherein
- the organic EL substrate and the color filter substrate are bonded and positioned relative to each other such that the at least one pixel region of the organic EL substrate is opposite the at least one pixel region of the color filter substrate,
- the organic EL layer is arranged between the lower reflective electrode and the upper transparent electrode, and
- the color conversion layer is formed on the upper transparent electrode.

5. The color conversion type organic EL display of claim 4, the organic EL substrate further including at least one bank separating the at least one pixel region of the organic EL substrate from another pixel region of the organic EL substrate.

6. The color conversion type organic EL display of claim 4, wherein the color filter substrate includes at least one color filter formed on a transparent substrate.

7. The color conversion type organic EL display of claim 4, wherein the color filter substrate further includes a black matrix separating the at least one pixel region of the color filter substrate from another pixel region of the color filter substrate.

8. A method comprising:
- forming an organic EL substrate including at least one pixel region and an organic EL layer between a lower reflective electrode and an upper transparent electrode;
- forming a color filter substrate including at least one pixel region;
- positioning the organic EL substrate and the color filter relative to each other such that the at least one pixel region of the organic EL substrate is opposite the at least one pixel region of the color filter substrate; and
- forming a color conversion layer on the upper transparent electrode.

* * * * *